United States Patent
Schoenmakers et al.

(10) Patent No.: US 10,903,043 B2
(45) Date of Patent: Jan. 26, 2021

(54) METHOD, DEVICE AND SYSTEM FOR REMOTE DEEP LEARNING FOR MICROSCOPIC IMAGE RECONSTRUCTION AND SEGMENTATION

(71) Applicant: FEI Company, Hillsboro, OR (US)

(72) Inventors: Remco Schoenmakers, Best (NL);
Maurice Peemen, Rijsbergen (NL);
Faysal Boughorbel, Eindhoven (NL);
Pavel Potocek, Eindhoven (NL)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 16/219,986

(22) Filed: Dec. 14, 2018

(65) Prior Publication Data
US 2019/0287761 A1    Sep. 19, 2019

(30) Foreign Application Priority Data
Dec. 18, 2017  (EP) ..................... 17208266

(51) Int. Cl.
*G06T 7/10* (2017.01)
*H01J 37/28* (2006.01)
(Continued)

(52) U.S. Cl.
CPC .............. *H01J 37/28* (2013.01); *G06N 3/08* (2013.01); *G06T 7/10* (2017.01); *G06T 7/174* (2017.01);
(Continued)

(58) Field of Classification Search
CPC ........... H01J 37/28; H01J 37/261; G06T 7/10; G06T 2207/20081; G06T 2207/10056;
(Continued)

(56) References Cited

U.S. PATENT DOCUMENTS

| 8,232,523 B2 | 7/2012 | Boughorbel et al. |
| 8,581,189 B2 | 11/2013 | Boughorbel et al. |

(Continued)

FOREIGN PATENT DOCUMENTS

| EP | 2958131 | 12/2015 |
| EP | 2963673 | 1/2016 |

OTHER PUBLICATIONS

Heinrich, Larissa, John A. Bogovic, and Stephan Saalfeld. "Deep Learning for Isotropic Super-Resolution from Non-Isotropic 3D Electron Microscopy." arXiv preprint arXiv:1706.03142 (2017) (Year: 2017).*

(Continued)

*Primary Examiner* — Wyatt A Stoffa

(57) ABSTRACT

The present invention relates to a method of training a network for reconstructing and/or segmenting microscopic images comprising the step of training the network in the cloud. Further, for training the network in the cloud training data comprising microscopic images can be uploaded into the cloud and a network is trained by the microscopic images. Moreover, for training the network the network can be benchmarked after the reconstructing and/or segmenting of the microscopic images. Wherein for benchmarking the network the quality of the image(s) having undergone the reconstructing and/or segmenting by the network can be compared with the quality of the image(s) having undergone reconstructing and/or segmenting by already known algorithm and/or a second network.

12 Claims, 3 Drawing Sheets

(51) Int. Cl.
    G06N 3/08     (2006.01)
    H01J 37/26    (2006.01)
    G06T 7/174    (2017.01)
    G06N 3/02     (2006.01)
    G06N 20/00    (2019.01)
(52) U.S. Cl.
    CPC .............. *H01J 37/261* (2013.01); *G06N 3/02* (2013.01); *G06N 20/00* (2019.01); *G06T 2207/10056* (2013.01); *G06T 2207/20081* (2013.01); *G06T 2207/20084* (2013.01); *G06T 2207/30024* (2013.01)
(58) Field of Classification Search
    CPC ... G06T 2207/10064; G06T 207/10061; G06T 2207/20084; G06T 2207/30024; G06T 7/174; G06N 3/08; G06N 7/023; G06N 20/00; G06N 3/02
    See application file for complete search history.

(56) References Cited

U.S. PATENT DOCUMENTS

| | | | |
|---|---|---|---|
| 8,586,921 | B2 | 11/2013 | Boughorbel et al. |
| 8,704,716 | B2 | 4/2014 | Kato et al. |
| 2017/0287137 | A1* | 10/2017 | Lin .................. G06N 3/08 |
| 2018/0075581 | A1* | 3/2018 | Shi .................. G06N 3/0472 |
| 2018/0144828 | A1* | 5/2018 | Baker .................. G16H 15/00 |
| 2018/0268255 | A1* | 9/2018 | Surazhsky ............ G06N 3/0454 |
| 2018/0276814 | A1* | 9/2018 | Frangioni .................. G06T 7/90 |
| 2018/0293500 | A1* | 10/2018 | Delp .................. G06N 3/0454 |
| 2018/0315190 | A1* | 11/2018 | Sasagawa .............. G06T 7/187 |
| 2019/0034802 | A1* | 1/2019 | Harshangi .............. G06N 3/088 |
| 2019/0050749 | A1* | 2/2019 | Sanketi .................. G06N 20/00 |
| 2019/0287230 | A1* | 9/2019 | Lu .................. G06N 3/0454 |
| 2020/0167914 | A1* | 5/2020 | Stamatoyannopoulos .................. G06N 20/00 |

OTHER PUBLICATIONS

Oren Z. Kraus, Jimmy Lei Ba, Brendan J. Frey, Classifying and segmenting microscopy images with deep multiple instance learning, Bioinformatics, vol. 32, Issue 12, Jun. 15, 2016, pp. i52-i59 (Year: 2016).*

Hollemans, Matthijs. "Machine learning on mobile: on the device or in the cloud." Retrieved from https://machinethink.net/blog/machine-learning-device-or-cloud/, published Feb. 16, 2017, downloaded May 28, 2020 (Year: 2017).*

Zeng, Tao, Bian Wu, and Shuiwang Ji. "DeepEM3D: approaching human-level performance on 3D anisotropic EM image segmentation." Bioinformatics 33.16 (2017): 2555-2562 (Year: 2017).*

Xing Fuyong et al, An Automatic Learning-Based Framework for Robust Nucleus Segmentation, IEEE Transactions on Medical Imaging, Feb. 2016, pp. 550-566, vol. 35, No. 2, IEEE Service Center, Piscataway, NJ, USA.

Sajjad Muhammad et al, Leukocytes Classification and Segmentation in Microscopic Blood Smear: A Resource-Aware Healthcare Service in Smart Cities, vol. 5, Dec. 13, 2016, pp. 3475-3489, IEEE Access.

Zhang Xiuxia et al: A Reliable Distributed Convolutional Neural Network for Biology Image Segmentation, 2015 15TH IEEE/ACM International Symposium on Cluster, Cloud and Grid Computing, IEEE, May 4, 2015, pp. 777-780.

W. H. Escovitz, et al, Scanning Transmission Ion Microscope with a Field Ion Source, Proc. Nat. Acad. Sci. USA vol. 72, No. 5, (1975), pp. 1826-1828, May 1975, Chicago, IL, USA.

Long, et al, Fully Convolutional Networks for Semantic Segmentation, 2015 IEEE Conference on Computer Vision and Pattern Recognition (CVPR).

Hao Chen et al, Deep Contextual Networks for Neuronal Structure Segmentation, Proceedings of the Thirtieth AAAI Conference on Artificial Intelligence, pp. 1167-1173, Association for the Advancement of Artificial Intelligence, 2016.

T. M. Quan, et al, Fusionnet: A deep fully residual convolutional neural network for image segmentation in connectomics, CoRR abs/1612.05360, 2016.

Chao Dong, et al, Learning a Deep Convolutional Network for Image Super-Resolution, in Proceedings of European Conference on Computer Vision (ECCV), 2014.

Chao Dong, Chen Change Loy, Kaiming He, Xiaoou Tang. Image Super-Resolution Using Deep Convolutional Networks, IEEE Transactions on Pattern Analysis and Machine Intelligence (TPAMI), Preprint, 2015.

Jiwon Kim, et al, Accurate Image Super-Resolution Using very Deep Convolutional Networks, The IEEE Conference on Computer Vision and Pattern Recognition (CVPR), 2016, pp. 1646-1654.

* cited by examiner

METHOD, DEVICE AND SYSTEM FOR REMOTE DEEP LEARNING FOR MICROSCOPIC IMAGE RECONSTRUCTION AND SEGMENTATION

FIELD

The invention relates to a method for automated microscopic image reconstruction and/or segmentation. The invention also concerns a cloud system and a microscopic system particularly configured to automated microscopic image reconstruction and/or segmentation. The images can origin from more than one device, such as more than one microscope or microscopic systems.

INTRODUCTION

The development of electron and scanning probe microscopies in the second half of the twentieth century has produced spectacular images of the internal structure and composition of matter with nanometer, molecular, and atomic resolution. Largely, this progress was enabled by computer-assisted methods of microscope operation, data acquisition, and analysis. Advances in imaging technology in the beginning of the twenty-first century have opened the proverbial floodgates on the availability of high-veracity information on structure and functionality. From the hardware perspective, high-resolution imaging methods now routinely resolve atomic positions with sub-Angstrom precision, allowing insight in the atomic structure and dynamics of materials.

Various kinds of microscopy can be relevant for the present invention, such as electron microscopy, charged-particle microscopy, Transmission Electron Microscope (TEM), Scanning Electron Microscope (SEM), and Scanning Transmission Electron Microscope (STEM), and also various sub-species, such as so-called "dual-beam" tools (e.g. a FIB-SEM), which additionally employ a Focused Ion Beam (FIB), allowing supportive activities such as ion-beam milling or Ion-Beam-Induced Deposition (IBID) or ion based imaging. This is a non-exclusive list of high performance microscopy approaches.

Functional imaging often leads to multidimensional data sets containing partial or full information on properties of interest, acquired as a function of multiple or even large number of parameters (time, temperature, or other external stimuli). Several recent applications of the big and deep data analysis methods to visualize, compress, and translate this multidimensional structural and functional data into physically, chemically relevant information have been disclosed.

The accumulating of an image of a specimen using a scanning-type microscope can comprise the following steps: directing a beam of radiation from a source through an illuminator so as to irradiate a surface S of the specimen; using a detector to detect a flux of radiation emanating from the specimen in response to said irradiation; causing said beam to follow a scan path relative to said surface; for each of a set of sample points in said scan path, recording an output Dn of the detector as a function of a value of a selected measurement parameter, thus compiling a measurement set; using a computer processing apparatus to automatically deconvolve the measurement set and spatially resolve it so as to produce reconstructed imagery of the specimen.

More specifically, in a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion the beam relative to the specimen.

As an alternative to the use of electrons as irradiating beam, charged-particle microscopy can also be performed using other species of charged particles. In this respect, the phrase "charged particle" should be broadly interpreted as encompassing electrons, positive ions (e.g. Ga or He ions), negative ions, protons and positrons, for instance.

As regards ion-based microscopy, some further information can, for example, be gleaned from sources such as the following: W. H. Escovitz, T. R. Fox and R. Levi-Setti, Scanning Transmission Ion Microscope with a Field Ion Source, Proc. Nat. Acad. Sci. USA 72(5), pp 1826-1828 (1975).

It should be noted that, in addition to imaging, a charged-particle microscope (CPM) may also have other functionalities, such as performing spectroscopy, examining diffractograms, performing (localized) surface modification (e.g. milling, etching, deposition), etc.

Apart from using charged particles as irradiating beam, it is also possible to perform scanning microscopy using a photon beam. An example of such a technique is so-called confocal microscopy, in which scanning irradiation by a point source of photons stimulates localized emanation of fluorescence radiation from the specimen. A detector can be used to collect (part of) this flux of fluorescence radiation and accumulate an image on the basis thereof.

A scanning-type microscope will comprise at least the following components: a radiation source, such as a Schottky source or ion gun in the case of a CPM, or a laser or lamp in the case of an optical microscope; an illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-)optical component also. If desired, the illuminator can be provided with a deflector system that can be invoked to cause its output beam to perform a scanning motion across the specimen being investigated. A specimen holder, on which a specimen under investigation can be held and positioned (e.g. tilted, rotated), can be also provided. If desired, this holder can be moved so as to effect the desired scanning motion of the beam w.r.t. the specimen. In general, such a specimen holder will be connected to a positioning system such as a mechanical stage. A detector, which may be unitary or compound/distributed in nature, and which can take many different forms, depending on the radiation being detected. Examples include photomultipliers (including solid-state photomultipliers, SSPMs), photodiodes, CMOS detectors, CCD detectors, photovoltaic cells, etc., which may, for example, be used in conjunction with a scintillator film, for instance.

Although various forms of scanning microscopy have been known for decades, they have a common shortcoming that is starting to manifest itself as a bottleneck in many areas of science and technology. This shortcoming has to do with the fact that scanning-based imaging tends to be a relatively slow and tedious process, which has therefore traditionally been limited to investigating very small (portions of) specimens, e.g. on a typical scale of tens of microns in CPMs and hundreds of microns in confocal microscopy. Yet, in many areas of human endeavor, there is an increasing need to maintain the resolution offered by these techniques, but to expand their imaging areas by orders of magnitude. For example: in cellular biology, there is a desire to expand cellular-level imaging to the tissue level, e.g. so as to more clearly investigate the interaction between (different types of) cells, particularly in brain tissue, muscle tissue, neoplasms (cancer tissue), etc.

In mineralogy/petrology, there is a need to expand analyses at molecular level to the level of grains and grain boundaries, e.g. so as to more clearly investigate gas trapping behavior in stone matrix material in tracking studies, precious metal encapsulation in quartz formations, unwanted inclusions in synthetic gems and other crystals, etc.

In the semiconductor industry, there is a desire to expand investigations at the level of individual junctions to a broader qualification of entire devices and arrays of devices, e.g. as when performing quality control vis-a-vis critical dimension, overlay, contamination, etc.

However, extending current scanning microscopy techniques to such large imaging scales would entail such hugely augmented image accumulation times as to basically render such extension untenable. Therefore, despite great desire and need, current techniques are so impractical as to exclude themselves from realistic applicability in this regard.

Another problem with present-day scanning microscopy techniques can manifest itself when imaging radiation-sensitive specimens, such as (living) biological specimens, cryogenic specimens, etc. The very act of irradiating such specimens with an energetic beam (particularly a charged-particle beam) tends to cause damage (such as molecular re-arrangement/mutation, thawing, desiccation, etc.) at/near an impingement footprint of the irradiating beam.

In order to mitigate this effect, one might consider reducing the intensity and/or increasing the scan speed of the irradiating beam, but such measures generally lead to an undesirable decrease in signal-to-noise ratio (SNR).

Such technologies are further described in EP 2 963 673 A1 as well as EP 2 958 131 A1 assigned to the assignee of the present invention. Such approaches have been also extensively developed in recent years by the assignee.

In particular, the following notable publications deserve mention: U.S. Pat. No. 8,232,523/EP 2 383 768 81, in which P is a property of the (incoming) radiation beam—such as beam energy, beam convergence angle or beam focal depth—and spatial resolution (de-convolution) is performed using a statistical Blind Source Separation (BSS) algorithm.

U.S. Pat. No. 8,581,189/EP 2 557 586 81, in which P is again a property of the (incoming) radiation beam—such as beam energy, beam convergence angle or beam focal depth and de-convolution of M is performed using a generalized three-dimensional reconstruction technique, e.g. on the basis of a Bayesian statistical approach.

U.S. Pat. No. 8,586,921/EP 2 557 587 A2, in which P is a property of the (emanating) radiation flux-specifically emission angle (e.g. of emitted secondary electrons) and de-convolution of M is again conducted using a general volumetric reconstruction algorithm.

U.S. Pat. No. 8,704,176/EP 2 648 208 A2, in which P is again a property of the (emanating) radiation flux—specifically energy of emitted electrons and de-convolution of M is once more achieved using three-dimensional reconstructive mathematics.

In the paper "Fully Convolutional Networks for Semantic Segmentation" Long et al., 2015 IEEE Conference on Computer Vision and Pattern Recognition (CVPR) describe convolutional networks. Those are powerful visual models that yield hierarchies of features. It is shown that convolutional networks by themselves, trained end-to-end, pixels-to-pixels, exceed the state-of-the-art in semantic segmentation. According to this paper the essence is to build "fully convolutional" networks that take input of arbitrary size and produce correspondingly sized output with efficient inference and learning. The authors define and detail the space of fully convolutional networks, explain their application to spatially dense prediction tasks, and draw connections to prior models. They adapt contemporary classification networks such as the AlexNet, the VGG net, and GoogLeNet into fully convolutional networks and transfer their learned representations by fine-tuning to the segmentation task. The authors further define a skip architecture that combines semantic information from a deep, coarse layer with appearance information from a shallow, fine layer to produce accurate and detailed segmentations.

The paper "Deep Contextual Networks for Neuronal Structure Segmentation" by Hao Chen et al., Proceedings of the Thirtieth AAAI Conference on Artificial Intelligence (AAAI-16) aims to manifest the interconnections of neural system with the Electron Microscopy (EM) images. The size of EM image data renders human annotation impractical, as it may take decades to fulfill the whole job. An alternative way to reconstruct the connectome can be attained with the computerized scheme that can automatically segment the neuronal structures. The segmentation of EM images is very challenging as the depicted structures can be very diverse. To address this difficult problem, a deep contextual network is proposed by leveraging multi-level contextual information from the deep hierarchical structure to achieve better segmentation performance. To further improve the robustness against the vanishing gradients and strengthen the capability of the back-propagation of gradient flow, auxiliary classifiers are incorporated in the architecture of a deep neural network. The method can allegedly effectively parse the semantic meaning from the images with the underlying neural network and accurately delineate the structural boundaries with the reference of low-level contextual cues.

In the paper T. M. Quan, D. G. C. Hildebrand, and W. Jeong. Fusionnet A deep fully residual convolutional neural network for image segmentation in connectomics. CoRR, abs/1612.05360, 2016. Arxiv, a novel deep neural network architecture is introduced, FusionNet, for the automatic segmentation of neuronal structures in connectomics data. FusionNet leverages advances in machine learning, such as semantic segmentation and residual neural networks, with the introduction of summation-based skip connections to allow a deeper network architecture for a more accurate segmentation.

An overview over deep convolutional neural networks (CNN), in particular over different network structures and parameter settings to achieve tradeoffs between performance and speed is provided in the papers Chao Dong, Chen Change Loy, Kaiming He, Xiaoou Tang. Learning a Deep Convolutional Network for Image Super-Resolution, in Proceedings of European Conference on Computer Vision (ECCV), 2014 and Chao Dong, Chen Change Loy, Kaiming He, Xiaoou Tang. Image Super-Resolution Using Deep Convolutional Networks, IEEE Transactions on Pattern Analysis and Machine Intelligence (TPAMI), Preprint, 2015.

The paper "Accurate Image Super-Resolution Using very Deep Convolutional Networks" (Jiwon Kim, Jung Kwon Lee, Kyoung Mu Lee; The IEEE Conference on Computer Vision and Pattern Recognition (CVPR), 2016, pp. 1646-1654) discloses a highly accurate single-image super-resolution (SR) method. The method uses a very deep convolutional network inspired by VGG-net used for ImageNet classification. Increasing the network depth shows a significant improvement in accuracy. The exemplified final model uses 20 weight layers. Cascading small filters many times in a deep network structure exploit contextual information over large image regions exploited in an efficient way. With very deep networks, however, convergence speed becomes a critical issue during training. It is proposed a simple yet effective training procedure. Residuals only are learned and use extremely high learning rates (104 times higher than before) enabled by adjustable gradient clipping. The method proposed performs better than existing methods in accuracy and visual improvements.

The paper Larissa Heinrich, John A. Bogovic, Stephan Saalfeld: Deep Learning for Isotropic Super-Resolution from Non-isotropic 3D Electron Microscopy.MICCAI (2) 2017:135-143 describes an adaption of an architecture (FSRCNN) for 3D super-resolution, and compares its performance to a 3D U-Net architecture that has not been used before to generate super-resolution. Both architectures have been trained on artificially downscaled isotropic ground truth from focused ion beam milling scanning EM (FIB-SEM) and the performance for various hyperparameter settings has been tested. It is concluded that both architectures can successfully generate 3D isotropic super-resolution from non-isotropic EM, with the U-Net performing consistently better.

All patent and non-patent literature cited before and the citations contained therein are incorporated herein by reference.

SUMMARY

In light of the above, it is the object of the present invention to provide a method, a device and a system for improving image reconstruction and/or segmentation.

This object is attained with the subject matter according to the claims.

The present invention is directed to a method of training a network for reconstructing and/or segmenting microscopic images. The images can be digital or digitized images. A network is intended to mean any software comprising a neuronal network.

The term image segmentation is understood to mean the process of partitioning a digital image into multiple segments (sets of pixels, also known as super-pixels, etc.). One goal of segmentation can be to simplify and/or change the representation of an image into something that is more meaningful and easier to analyze. Image segmentation is typically used to locate objects and boundaries (lines, curves, etc.) in images. More precisely, image segmentation is the process of assigning a label to every pixel in an image such that pixels with the same label share certain characteristics.

The term image reconstruction is the process of capturing the shape and appearance of objects.

The method further comprises the step of training the network in the cloud. The term cloud also referred to as cloud computing is intended to mean one or more computer networks, server(s), storage(s), application(s) and/or service(s) that is/are remotely accessible by users.

For training the network in the cloud, training data comprising microscopic images are uploaded into the cloud and a network is trained by the microscopic images. The uploading can take place by any means of data transfer such as by cables, wireless and/or both and can be done sequentially, in packages and/or in parallel.

For training the network, the network results are benchmarked after the reconstructing and/or segmenting of the microscopic images. The results of the reconstruction and segmentation of the images can be checked for quality parameter(s) and/or quality indication(s). The benchmarking can comprise the provision of a grade for the quality parameter(s) and/or quality indication(s).

For benchmarking the network, the quality of the image(s) having undergone the reconstructing and/or segmenting by the network is/are compared with the quality of the image(s) having undergone reconstructing and/or segmenting by an already known and/or second network. This known or second network can be preselected according to the profile of the images and/or of the tasks. It can be taken from a library that can be also located in the cloud.

A further step of training the network can be taken wherein factors in the network and/or their relationships are automatically modified and benchmarked in order to optimize the network.

Another step of reconstructing and/or segmenting the microscopic images by the trained network can be initiated and performed. This can first be done in the cloud in order to check and/or benchmark the quality of the images, in particular with another network as described before.

A local microscopic system can be provided for capturing further images and for receiving the pre-trained network after training it in the cloud and after its transfer to the local microscopic system so that the pre-trained network is adapted to locally reconstruct and/or segment the further images. This can also apply for a plurality or larger number of local microscopic systems that are remotely located to each other.

The pre-trained and locally operating network is regularly tested and/or benchmarked in the cloud and therefor regularly transferred from the local microscope system into the cloud. The transfer can be done via known communication media.

The pre-trained network is transferred back from the cloud to the local microscopic system in improved form as a trained network in order to replace the relevant network already locally in place in case the pre-trained network has been further improved in the cloud. The trained network can also be optionally provided in parallel in the microscopic device so that the pre-trained network(s) and/or the trained network(s) compute the images upon request. The request can be selected by a user interface.

Moreover, step(s) can be added, such as the step of gathering images by at least one of single particle analysis, cryo-electron microscopy, volume scope data acquisition, neuron reconstruction, image super-resolution, single-image resolution and/or single-image super-resolution. This is not an exclusive list and anything close, similar and/or equivalent to these techniques as well as further developments thereof are also covered by the present invention. The gathering of images can particularly be done by the microscope, Single particle analysis is a group of related computerized image processing techniques used to analyze images from transmission electron microscopy (TEM). These methods were developed to improve and extend the information obtainable from TEM images of particulate samples, typically proteins or other large biological entities such as viruses. Individual images of stained or unstained particles are very noisy, and so hard to interpret. Combining several digitized images of similar particles together gives an image with stronger and more easily interpretable features This technique builds up a three-dimensional reconstruction of the particle. Using Single Particle Analysis, it has become possible to generate reconstructions with sub-nanometer resolution and near-atomic resolution.

Cryo-electron microscopy (cryo-EM) or electron cryomicroscopy, is a form of transmission electron microscopy (TEM) where the sample is studied at cryogenic temperatures (generally liquid-nitrogen temperatures). Cryo-EM is gaining popularity in structural biology.

The utility of cryo-electron microscopy stems from the fact that it allows the observation of specimens that have not been stained or fixed in any way, showing them in their native environment. A version of electron cryo-microscopy is cryo-electron tomography (CET), where a 3D reconstruction of a sample is created from tilted 2D images, this reconstruction being also embraced by the term cryo-electron microscopy throughout this application.

Volume scope data acquisition usually employs a SEM and a multi-energy de-convolution SEM enabling a z-resolution (so into depth). It unravels 3D architecture of structures such as cells or tissue in their natural context. It is inter alia referred to the documentation of the "Teneo VolumeScope SEM" of the present assignee.

Neuron tracing or neuron reconstruction is a technique used in neuroscience to determine the path of neural axons and dendrites (many times also called neuronal processes).

Super-resolution imaging (SR) is a class of techniques that enhance the resolution of an imaging system. In some SR techniques—termed optical SR—the diffraction limit of systems is transcended, while in others—geometrical SR—the resolution of digital imaging sensors is enhanced.

Methods for super-resolution can be broadly classified into two families of methods: (i) The classical multi-image super-resolution (combining images obtained at sub-pixel misalignments), and (ii) Example-Based super-resolution (learning correspondence between low and high resolution image patches from a database). These families can be combined to obtain super resolution from as little as a single image (with no database or prior examples). It is based on the observation that patches in a natural image tend to redundantly recur many times inside the image, both within the same scale, as well as across different scales. Recurrence of patches within the same image scale (at sub-pixel misalignments) gives rise to the classical super-resolution, whereas recurrence of patches across different scales of the same image gives rise to example-based super-resolution. Each pixel can be recovered to its best possible resolution increase based on its patch redundancy within and across scales.

The training in the cloud is executed for training at least one of a deep convolutional network, preferably a very deep convolutional network, an enhanced deep residual network (EDSR) and/or multi-scale deep super-resolution system (MDSR). This is not an exclusive list and anything close, similar and/or equivalent to these techniques as well as further developments thereof are also covered by the present invention.

Deep learning is a machine learning process wherein a network is trained that uses a matrix of more than one hidden layer containing factors or neurons that correlate linearly and particularly non-linearly.

Convolutional networks or convolutional neural networks or CNN is a feed-forward artificial neural network comprising one or more convolutional layers and pooling layers. Each successive layer uses the output from the previous layer as input. The algorithms may be supervised or unsupervised and applications include pattern analysis (unsupervised) and classification (supervised).

Very deep convolutional networks comprise a more than average repetition of the convolutional and pooling layers.

Recent research on super-resolution has progressed with the development of deep convolutional neural networks (DCNN). In particular, residual learning techniques exhibit improved performance. An enhanced deep super-resolution network (EDSR) has been developed with performance exceeding those of current state-of-the-art super-resolution methods. This can be done by optimization by removing unnecessary modules in conventional residual networks. The performance is further improved by expanding the model size while the training procedure is stabilized. A new multi-scale deep super-resolution system (MDSR) and training method is meanwhile also developed which can reconstruct high-resolution images of different upscaling factors in a single model.

A further step of capturing the images can be performed by a plurality of microscopic devices and feeding the images into the cloud for training the network and/or the further step of transmitting the trained network to the plurality of microscopic devices. This is an approach to improve networks upstream by a number of microscopic devices by collecting their images that increase the number of sample images for training. Downstream the better-trained network(s) can then be applied to not just one microscopic device but to a number of them.

The present invention can comprise further the step of providing a library of pre-trained networks and selecting a pre-trained network from the library according to an initial analysis of the images received in the cloud. The library can be manually and/or automatically approached for selection.

An initial analysis can also comprise the step of detecting which of the pre-trained networks results closest to the images desired before selecting the pre-trained network, preferably by analyzing or estimating the quality. This can also be done manually, semi-automatically and/or automatically.

Further, a step of regularly checking the quality and/or accuracy of the trained network can be applied. This can be triggered on a regular basis, upon pre-set criteria and/or manually.

The present invention also relates to a computer-readable medium with a computer program for carrying out a before-described method.

Moreover, the invention also covers a cloud system that is configured to be remotely accessible by local microscopic systems and configured to carry out the before-described method.

A microscope system is a microscope being configured to gather microscopic images and at least a computer or similar device being configured to run a network being itself adapted to reconstruct and/or segment the microscopic images.

Moreover, the invention relates to (a) microscopic system(s) that is/are locally arranged and configured to send microscopic images into the cloud for training pre-trained networks in the cloud and/or being configured to receive trained networks in order to locally reconstruct and/or segment microscopic images by the network.

The present invention can further comprise a microscope being adapted for at least gathering images by at least one of single particle analysis, cryo-electron microscopy, volume scope data acquisition, neuron reconstruction, image super-resolution, single-image resolution and/or single-image super-resolution.

The present invention also covers a use of a method and/or a microscopic system according to the embodiments described for at least one of single particle analysis, cryo-electron microscopy, volume scope data acquisition, neuron reconstruction, image super-resolution, single-image resolution, single-image super-resolution.

On the one hand, the prior art image reconstruction and segmentation is slow and not suited for "live" on-tool calculation. On the other hand, the present common bandwidth hinders a cloud-based transmittal of figures to be reconstructed and segmented in the cloud.

Moreover, it is advantageous to invest a considerable effort and time for training the network for the deep learning image reconstruction and segmentation to deliver fast and high quality results. To make use of the cloud can provide the effect and advantage to not provide each microscopic device with highly sophisticated and expensive local data processing equipment necessary for training the network.

The present invention can provide the advantage to conduct the process of image reconstruction and segmentation with minimal data transport and, thus, minimal time loss. Additionally, the quality of the network inference will improve, as there is more data available in the cloud from different sites for network training purposes.

It is one of the preferred advantages or purposes of the present invention to offload the training step of the network to the cloud and download the trained network back once quality is assured. This preferably makes it possible to use much more sophisticated computing power than at the microscope site.

According to another preferred advantage or effect, pre-trained networks of previous runs or similar machines are benchmarked so that before starting the training a basis for the network can be easily and quickly achieved. The benchmarks can be appointed after an initial analysis of images captured and received in the cloud.

The periodic checking of the accuracy of the network, and re-optimizing multiple machines based on input from them can be also realized. In particular, this enables a generic workflow concept applicable across a plurality of microscopes and the same or different kinds of microscopes. In this manner the microscopes can learn from each other and/or from past images and imaged defects etc.

The present invention can provide accurate image super-resolution, particularly by being able to apply and train very deep convolutional networks parallel to the microscopy activities. For this it can use the deep convolutional networks to remove low or high frequency artifacts from images that are caused by up-scaling.

Another advantage lies in the quality and reduction of training data set and computing time for reconstruction of images that are considerably de-noised.

The present technology will now be discussed with reference to the accompanying drawings.

DESCRIPTION OF EMBODIMENTS

Figure 1:
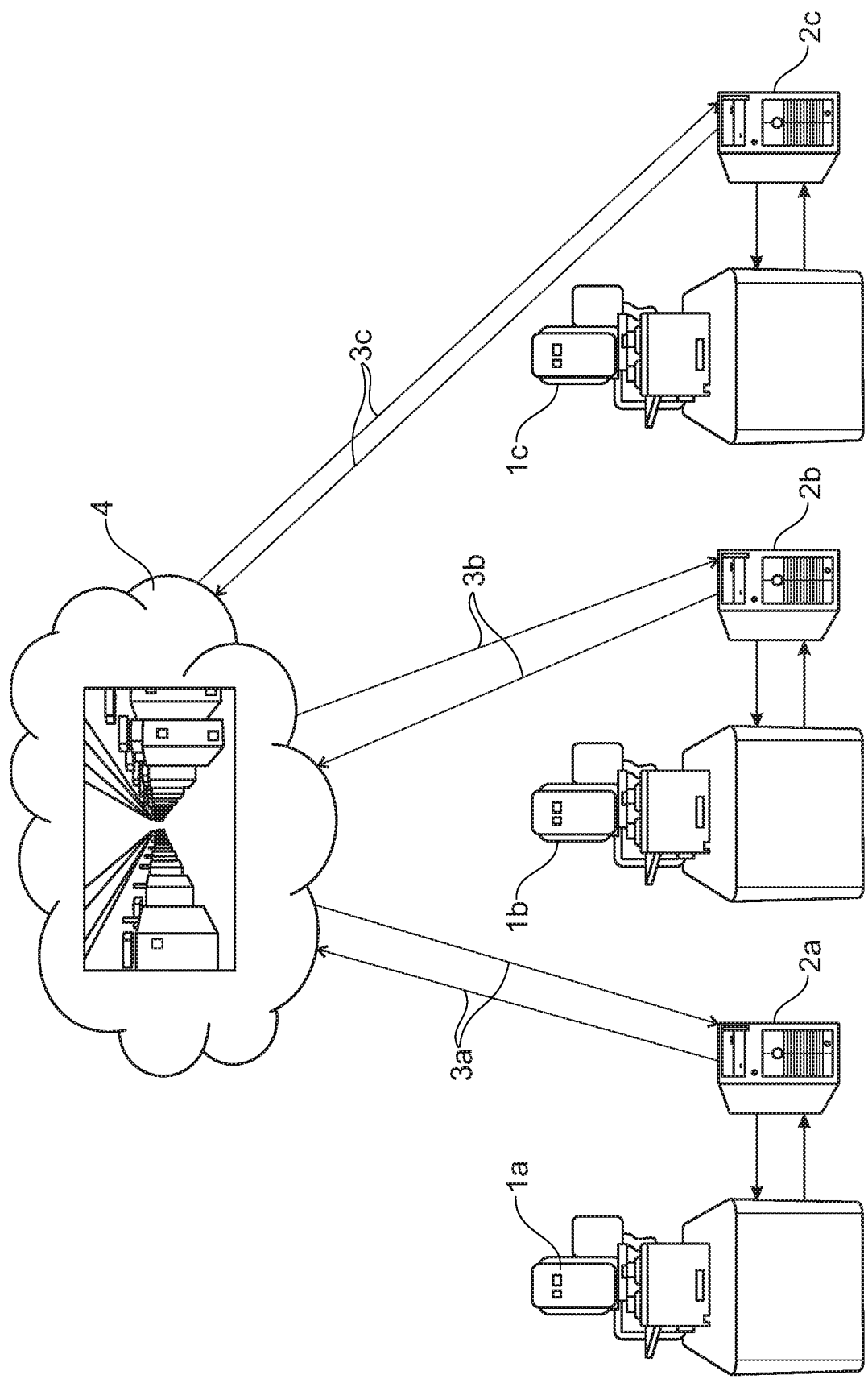
FIG. 1 shows an embodiment of a number of microscopic systems connected to a cloud in accordance with the present invention.

FIG. 1 shows an embodiment with a number of microscopic systems 1, 2 that can each or individually comprise a microscope 1 (hereinafter used for 1a-1c) and a computer or computing device 2 (hereinafter used for 2a-2c) and optionally other devices. Both can be integrated devices as well and/or can be distant to each other. The microscope can be of any kind, particularly as defined or exemplified before.

A communication channel 3 (hereinafter used for 3a-3c) can unidirectional or bidirectional connect the microscopic device(s) with a remote cloud 4. The communication channels can be different and can comprise (a) wired and/or wireless communication section(s).

Figure 2:
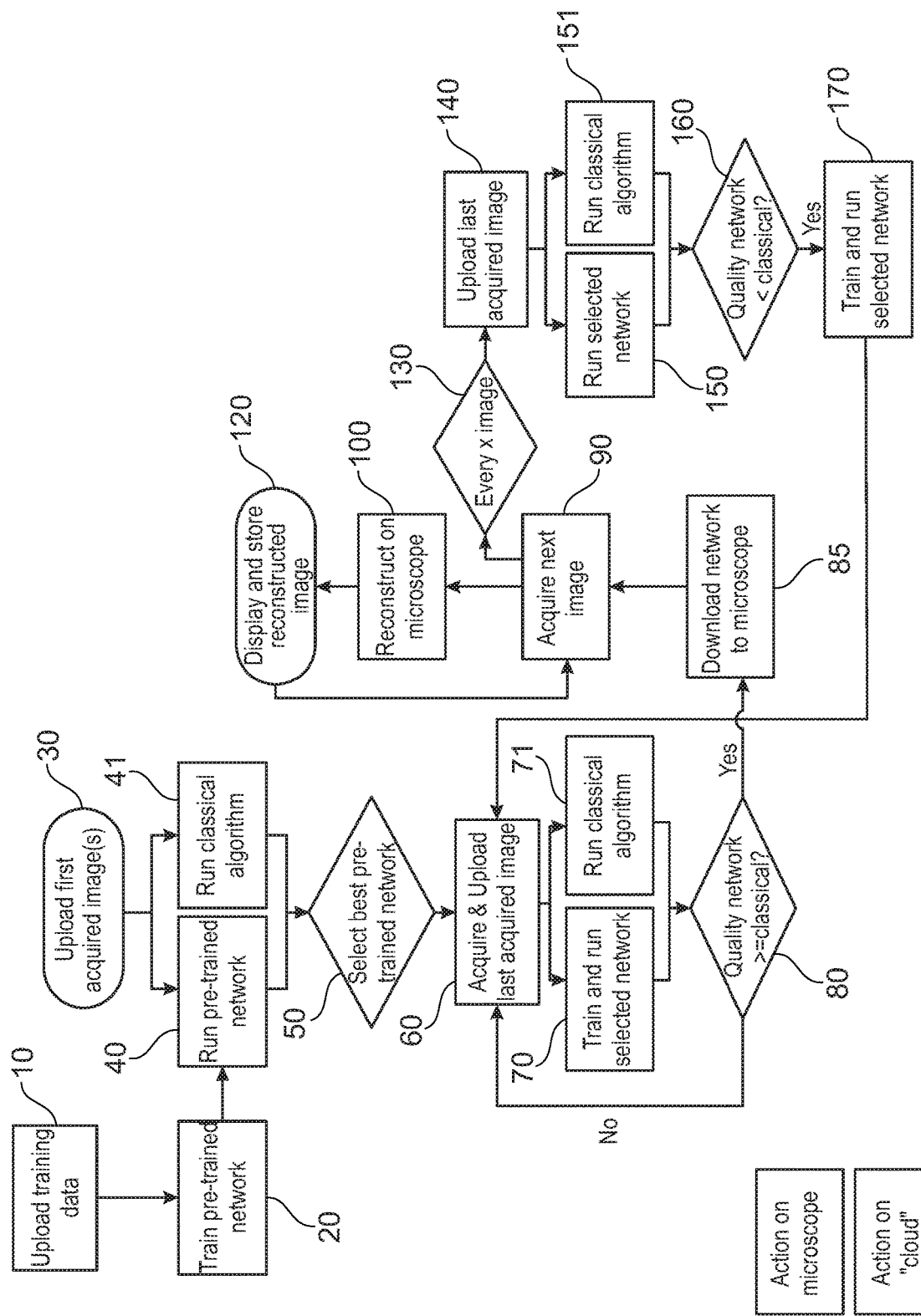
FIG. 2 depicts of a flow chart with an embodiment in accordance with the present invention.

FIG. 2 schematically depicts an embodiment of the invention. It shows a very specific embodiment for exemplifying purposes only. Many alterations are possible that are still in line with the present invention.

One of a plurality of examples could be a SEM microscope configured for high quality imaging that requires a long acquisition time. For example, it takes a stack of 4096×4096 point images with a dwell time of 10 µs, requiring 168 seconds per image. For scenarios where a large volume must be acquired, i.e. a large number of 4096×4096 frames, the acquisition time constitutes a severe bottleneck. To speed up acquisition, compressive sensing techniques can be used for fast acquisitions. While maintaining the same field of view the number of point can be reduced to 1024×1024. This results in a reduced acquisition time of a factor of 16. Additionally, a reduced dwell time of 0.1 µs per point can be used and as a result, the acquisition data rate increases to $D_r$=160 Mbit/s and more importantly the acquisition time reduces to a more practical 0.1 seconds per frame.

In a first step 10 training data comprising image data is uploaded into the cloud after its generation by one or more microscopes and optionally associated devices and/or by use of a respective collection collected over the past. The data can originate from one or more kinds of sources, such as one or more particle analyzing microscope(s). The uploading can take place by any known means as long as the uploading speed is appropriate.

On the basis of the image data a network can be trained to obtain a pre-trained network in a step 20. As a starting point an already known network or newly developed network can be taken, such as described in the art mentioned before. Additionally an already pre-trained network or a plurality of pre-trained networks can be further developed or trained for the deep learning of the network(s). This can be one or more network(s) that have been the result of previous analysis and/or already existing networks. In case of a plurality of networks they can be stored in one or more libraries. They can be labeled according to their kinds, fields of application, strengths and/or weaknesses. E.g., they could be assigned to certain protein structures, viruses, chemical structures, semiconductors, minerals etc.

The training can be done sequentially and/or by parallel computing. As it is done in the cloud remote from the local microscope system and potentially associated infrastructure the training and/or testing in the cloud can be performed in parallel to the operation of the local microscope(s).

The network(s) or pre-trained networks can be further trained. One example is to upload the first image(s) acquired in step 30. These first images then undergo alternative networks in step 40 and/or classical algorithms in step 41. Alternatively or additionally, the factors in the network can be modified and optimized to improve the output of the network.

Thereafter the quality of the results can be checked and compared and the most appropriate approach, i.e. the most appropriate network is selected. The quality of the results can be based on one or more criteria, such as the capturing of the image, the grade of improvement of the image, the segmenting, noise to signal ratio, edge criteria etc. The tests can comprise negative and/or positive selection criteria.

As one possible result, the most appropriate or best pre-trained network will be selected in a step 50. This can depend on the criteria and/or can be selected manually, semi-manually and/or automatically.

In a next step 60, a further image or set of images or the last portion of the images is uploaded from the microscope or the microscope systems or environment in order to further train and run the network. The training and running of the network takes place in step 70. In parallel the data can undergo one or more classical algorithms in a step 71 in order to benchmark the outcome of the network's performance.

Thereafter, the quality of the outcomes of the network in step 70 and of the algorithm in step 71 are compared in a step 80. This can be done in the manner as already described before. Should the quality of the network's result be inferior to the one run by a classical algorithm, the network can undergo further training, e.g. on the basis of further image(s). For that it can go back to step 60 where another selected network can be selected and/or further images can be uploaded for the further training of the previous network or the training of another network.

Should in step 80 the result of the selected network be better in quality than the classical algorithm or of the network compared, the network can be downloaded to the microscope system or a plurality of microscope systems. In this context the term microscope comprises the microscope, any local infrastructure and/or any computer implemented system locally assigned to the microscope. Thus, the network will be transferred from the cloud to the local microscope system in a Step 85 to run locally at or close to the microscope system.

In a step 90 a plurality of next image(s) is/are acquired. This image or these images are reconstructed in a step 100 on the microscope. This can also comprise the single particle image approach. In a step 120 the reconstructed image(s) is/are displayed and stored. The storage can be done locally and/or in the cloud.

In steps 140, 150, 151, 160 and 170 steps 60 to 80 are performed in a similar manner. That is an uploading of the last image acquired by the microscope in step 140, then run the network selected and alternatively a classical algorithm and/or another network for benchmarking or testing the network selected.

COMPARATIVE EXAMPLES

Figure 3:
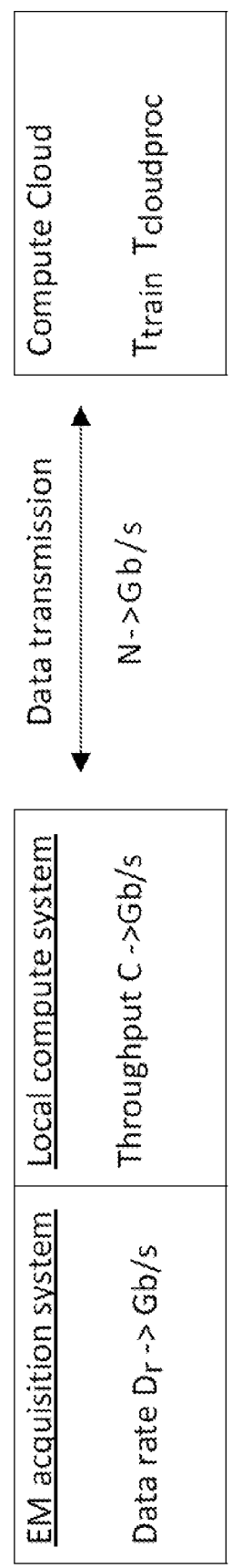
FIG. 3 illustrates a microscope acquisition system connected to a compute cloud.

Two data processing scenarios around a microscope acquisition system are compared with one that is connected to a compute cloud. FIG. 3 illustrates data a microscope acquisition system connected to a compute cloud.

Scenario 1: Perform Data Processing Locally on the Acquisition System

In the common case where the data rate $D_r$ of the system is larger than the compute throughput C the system cannot or can hardly perform live processing. When $C \ll D_r$ live processing is hardly or not possible at all.

Scenario 2: Perform Data Processing in the Cloud

According to the present invention perform the processing in a compute cloud with more computational resources. However, in case the data rate $D_r$ of the system is larger than the bandwidth to the cloud N the system cannot perform live processing. When $N \ll D_r$ live processing in the cloud is not possible. In practice the data rate requirements could be even larger in case the results must be transferred back through a shared transmission resource. This increases the data rate requirement $D_r$ with a factor k that spans a domain $1 \le k \ll x$ depending on the application. For now we leave out this factor k for simplicity.

Scenario 3: Hybrid Use of the Cloud to Obtain a Faster Approximate Model Locally The new scenario 3 proposes to replace the classical algorithm with a throughput C by an approximate algorithm with throughput $\acute{C}$.

In case the throughput of $\acute{C} > C$ some interesting scenario's can occur.
1. If $\acute{C} > C$ but still $\acute{C} \le D_r$ a delayed processing can be performed. A speedup over the original is possible but live processing cannot be formed.
2. If $\acute{C} > C$ and $\acute{C} > D_r$ live processing scenario can be considered.

To obtain an approximate algorithm with throughput $\acute{C}$, which delivers acceptable or similar quality compared to C, deep learning techniques are used that require training time. This training in the cloud introduces a latency penalty to the approximate algorithm. The combined latency and throughput will define if the new scenario 3 has an advantage over the existing scenarios 1 and 2.

Processing Volume Comparisons

The time for acquiring a data set is given as $$T_D = \frac{S_{frame}}{D_r}$$

and the time for processing would be $$T_P = \frac{S_{frame}}{C}.$$

The difference between these two defines our processing margin, which is given by $T_L = (T_P - T_D)$. For the processing margin there are two possible scenarios:
1. $T_L \le 0$ Over capacity; live processing is possible in scenario 1 by local computation.
2. $T_L > 0$ Under capacity, so more data is generated than can be processed. Live processing is not possible and delayed processing requires adequate buffering.

Solve Under Capacity with a Deep Learning Based Solution

In case of under capacity one can switch to a deep learning based approximate algorithm with more throughput $\acute{C}$. This requires a training task in the cloud and a portion of the data $S_{train}$ to be transferred for training. Both tasks introduce additional latencies $$T_{Nt} = \frac{S_{train}}{N}$$

for transmission and $T_{train}$ for the training task. As a result a new deep learning based processing margin can be computed by adding the terms $T_{Nt}+T_{train}+T_L$. As a result, scenario 3 improves overall system throughput when Equation (1) is valid.

$$T_{Nt}+T_{train}+T_L<T_L \quad (1)$$

Again this results in three scenarios:
1. In case the inequality of Equation (1) is not valid, so $T_{Nt}+T_{train}+T_L \geq T_L$ there is no benefit for applying the deep learning solution. Although the deep learning approximate algorithm has more throughput compared to the original algorithm ($\acute{C}>C$) the overhead of training can cause that the solution cannot process more data in a given amount of time.
2. In case $T_{Nt}+T_{train}+T_L \leq 0$ live processing is possible for at least a portion on the data collection procedure. In this scenario the approximate algorithm and the amount of time for the acquisition make that there is enough over capacity to fully absorb the penalty of training. Initially some buffer space is required but over time the approximate solution will empty the buffer since it processes data faster than the production rate. When the last frame is produced the result will be ready with minimal latency.
3. When $T_{Nt}+T_{train}+T_L<T_L$ there is a speedup over the original algorithm but live processing is not possible. In this scenario the buffer is not empty when the last frame is produced, so the system will require some additional time to show the last frame. However, the total delay is less than for the original algorithm.

Real-World Reconstruction Application

A SEM microscope configured for high quality imaging requires a long acquisition time. For example it takes a stack of 4096×4096 point images with a dwell time of 10 μs, requiring 168 seconds per image. For scenarios where a large volume must be acquired (many of these 4096×496 frames) this acquisition time is a severe bottleneck. To speed up acquisition, compressive sensing techniques can be used for fast acquisitions. For instance one could use a dwell time of 0.1 μs per point and while maintaining the same field of view we reduce the number of point to 1024×1024. As a result, the acquisition data rate increases to $D_r$=160 Mbit/s and more importantly the acquisition time reduces to a more practical 0.1 seconds per frame.

Scenario 1: Local Processing

Advanced reconstruction algorithms from the compressive sensing domain can reconstruct a clean 4096×4096 pixel image from the noisy sparse data. This may require 20 hours of processing per frame on a workstation, so the acquisition bottleneck is transformed into a compute bottleneck. By optimizing the reconstruction algorithm and mapping to GPUs we can speed up, e.g. to 20 minutes of processing time. Note that in the improved GPU scenario the local compute throughput of C=14 kbit/s will prevent live processing and causes a buffering requirement that quickly grows for large acquisitions. Therefore, the local processing scenario 1 seems impossible, since $C \ll D_r$.

Assumed that a volume of 4096 frames can be scanned in compressive sensing mode where each frame consists of 1024×1024 points. The classical algorithm faces a huge under capacity $$T_L = T_P - T_D = \frac{16 \text{ Mbit}}{14 \text{ kbit/s}} - \frac{16 \text{ Mbit}}{160 \text{ Mbit/s}} = 1200 \text{ s/frame}.$$

For 4096 frames this explodes to 1363 additional processing hours after the last frame is acquired.

Scenario 2: Data Processing in the Cloud

A cloud infrastructure can provide much more compute power, so let's assume that $C_{cloud}$=1 Gbit/s. However, the transport bandwidth N to the cloud is limited, e.g. 100 Mbit/s. As a result, streaming the acquisition data rate $D_r$=160 Mbit/s live to the cloud would be difficult. In addition it would be difficult to retrieve the processed and up scaled results ($D_r \cdot 16$=2560 Mbit/s) in a live mode. Clearly, scenario 2 faces a data transport problem $N \ll k \cdot D_r$.

In case we try an in-cloud scenario where 4096 frames are processed in the cloud.

$$T_{Cloud} = T_{Up} + T_{Back} = (S_{frame} + S_{reconstructed\,frame})\frac{f}{N} =$$
$$(16 \text{ Mbit} + 268 \text{ Mbit})\frac{4096}{100 \text{ Mbit/s}} = 3.2 \text{ hour}.$$

We assume no additional latency for the processing in the cloud. The acquisition of the 4096 frames requires only 7 minutes, so after acquiring the last frame a transfer time of 3 hours is required to obtain the full reconstructed dataset.

Scenario 3: Hybrid Use the Cloud to Obtain a Faster Approximate Solution

A trained deep convolutional network can perform the reconstruction task much faster compared to the compressive sensing solution. For example, a naïve GPU mapping of a trained convolutional network performs the frame reconstruction task in 2 seconds instead of 20 minutes. Here a speedup over the original algorithm $\acute{C}>C$ is achieved, but live processing is not possible. Processing cannot keep up with the acquisition data rate $\acute{C} \lesssim D_r$, were $\acute{C}$=8.4 Mbit/s and $D_r$=160 Mbit/s. However, also the acquisition has latencies (stage moves, cutting of sections etc.) which introduce sufficient delays to make this still semi-live.

With more effort, highly tuned networks and matched mappings on FPGAs or GPUs can speed up the inference speed by 40× resulting in 0.05 seconds processing time per frame. This enables live processing if the training latency by the processing can be hidden. In this scenario the local processing throughput increases to $\acute{C}$=336 Mbit/s.

In case we use a deep learning solution we should first transfer a training set to the cloud, e.g. 128 frames. Since there is a transport rate limitation to the cloud this will give a latency penalty $$T_{Nt} = \frac{f \cdot s_{frame}}{N} = \frac{128 \cdot (16 \text{ Mbit})}{100 \text{ Mbit/s}} = 21 \text{ s}.$$

In addition, cloud time for training is required, e.g. for selection of a pre-trained network and fine tuning on our dataset 20 minutes are added ($T_{train}$=1200s). The new processing margin for a naïve neural network mapping would be $$T_L = T_P - T_D = \left(\frac{1}{8.4 \text{ Mbit/s}} - \frac{1}{160 \text{ Mbit/s}}\right)16 \text{ Mbit} = 1.9 \text{ s/frame}.$$

For 4096 frame this would already give a speedup over the classical scenario. $T_{Nt}+T_{train}+t_L$=21s+1200s+7751s=2.5h additional processing delay after acquiring the last frame, which is a substantial improvement over the 1363 hours in the classical case locally.

Live processing is only achieved if a negative $T_L$ is obtained, so the throughput of the neural networks is optimized with FPGAs or GPUs to $\dot{C}$=336 Mbit/s. In this improved scenario $$T_L = T_P - T_D = \left(\frac{1}{336 \text{ Mbit/s}} - \frac{1}{160 \text{ Mbit/s}}\right)16 \text{ Mbit} = -0.05 \text{ s/frame.}$$

This margin can be used to make up for the training latency. For 4096 frames this would not be sufficient $T_{Nt}+T_{train}+T_L$=21s+1200s−205s=24 minutes of additional delay. However, from a job size of 24420 frames and more there would be no processing delay after the acquisition of the last frame. The processing margin f·$T_L$ must be −1221 seconds to compensate the training latency. Note that these numbers change depending on the characteristics of the algorithm and the platform.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be the preferred order, but it may not be mandatory to carry out the steps in the recited order. That is, unless otherwise specified or unless clear to the skilled person, the order in which steps are recited may not be mandatory. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

The invention claimed is:

1. A method of training a network for reconstructing and/or segmenting microscopic images comprising:
   acquiring microscopic images with a local microscopic system at a data acquisition rate greater then a compute throughput of the local microscopic system;
   uploading one or more first acquired microscopic images of the acquired microscopic images to the cloud;
   training the network in the cloud with the first acquired microscopic images, wherein training the network includes selecting a pre-trained network from a library of pre-trained networks in the cloud by assessing the pre-trained networks with the first acquired microscopic images, and training the selected pre-trained network in the cloud;
   downloading the trained network to the local microscopic system; and
   reconstructing and/or segmenting the acquired microscopic images in the local microscopic system using the downloaded network.

2. The method according to claim 1, further comprising uploading multiple microscopic images into the cloud, and wherein training the network in the cloud includes training the pre-trained networks with the uploaded microscopic images in the cloud.

3. The method according to claim 1, further comprising benchmarking the trained network before downloading the trained network to the local microscopic system.

4. The method according to claim 3, wherein benchmarking the trained network includes comparing a quality of a further image reconstructed and/or segmented by the trained network with a quality of the further image reconstructed and/or segmented by a second network.

5. The method according to claim 4, wherein the second network is selected from a library of networks located in the cloud.

6. The method according to claim 1, further comprising capturing further images using the local microscopic system and adapting the downloaded network to reconstruct and/or segment the further images in the local microscopic system.

7. The method according to claim 1, further comprising after acquiring every predetermined number of microscopic images, uploading a last acquired microscopic image from the local microscopic system to the cloud, and testing and/or benchmarking the trained network in the cloud based on the last acquired microscopic image.

8. The method according to claim 7, further comprising downloading the improved network from the cloud to the local microscopic system; and replacing the trained network in the local microscopic system with the improved network.

9. The method according to claim 1, wherein the microscopic image is acquired by at least one of single particle analysis, cryo-electron microscopy, volume scope data acquisition, neuron reconstruction, image super-resolution, single-image resolution, single-image super-resolution.

10. The method according to claim 1, wherein the network is least one of a deep convolutional network, an enhanced deep residual network (EDSR), and a multi-scale deep super-resolution system (MDSR).

11. The method according to claim 2, wherein downloading the trained network to the local microscopic system includes downloading the trained network to one or more of the plurality of local microscopic devices.

12. A cloud system remotely accessible by a plurality of local microscope systems, the cloud system is configured to:
   receive one or more first acquired microscopic images from a local microscopic system of the plurality of local microscopic systems, wherein the local microscopic system acquires microscopic images including the first acquired images at a data acquisition rate greater than a compute throughput of the local microscopic system;
   train a network in the cloud system with the first acquired microscope images, wherein train the network includes selecting a pre-trained network from a library of pre-trained networks in the cloud system by assessing the pre-trained networks with the first acquired microscopic images, and training the selected pre-trained network in the cloud; and
   send the trained network to the local microscopic system for reconstructing and/or segmenting a microscopic image acquired by the local microscopic system in the local microscopic system.

* * * * *